United States Patent
Iwao (10) Patent No.: US 8,620,612 B2
(45) Date of Patent: Dec. 31, 2013

(54) EQUIVALENT CIRCUIT OF INDUCTANCE ELEMENT, METHOD OF ANALYZING CIRCUIT CONSTANT, CIRCUIT CONSTANT ANALYSIS PROGRAM, DEVICE FOR ANALYZING CIRCUIT CONSTANT, CIRCUIT SIMULATOR

(75) Inventor: Hidemi Iwao, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 160 days.

(21) Appl. No.: 13/133,922

(22) PCT Filed: Dec. 7, 2009

(86) PCT No.: PCT/JP2009/070792
§ 371 (c)(1),
(2), (4) Date: Jun. 9, 2011

(87) PCT Pub. No.: WO2010/067880
PCT Pub. Date: Jun. 17, 2010

(65) Prior Publication Data
US 2011/0246120 A1 Oct. 6, 2011

(30) Foreign Application Priority Data
Dec. 10, 2008 (JP) .................................. 2008-314987

(51) Int. Cl.
*G01R 27/26* (2006.01)
*G06F 19/00* (2011.01)

(52) U.S. Cl.
USPC .............................. 702/117; 324/691; 703/14

(58) Field of Classification Search
USPC ............ 702/117; 703/3, 13, 14; 324/658, 691
See application file for complete search history.

(56) References Cited

U.S. PATENT DOCUMENTS

| 6,321,169 B1 * | 11/2001 | Iwao ............................... 702/65 |
| 6,566,872 B1 * | 5/2003 | Sugitani ........................ 324/249 |
| 2003/0101418 A1 | 5/2003 | Draxler et al. |
| 2005/0028117 A1 | 2/2005 | Yokoyama et al. |

FOREIGN PATENT DOCUMENTS

| JP | 11-312187 A | 11/1999 |
| JP | 3482351 B2 | 12/2003 |
| JP | 2004-235279 A | 8/2004 |
| JP | 2005-063431 A | 3/2005 |
| JP | 2005-534083 | 11/2005 |

OTHER PUBLICATIONS

Sushanta K. Mandal et al., "A Wide-band Lumped Element Compact CAD Model of Si-Based Planar Spiral Inductor for RFIC Design", Proceedings of the 19th International Conference on VLSI Design, IEEE, 2006, 6 pages.*

(Continued)

*Primary Examiner* — Michael Nghiem
*Assistant Examiner* — Alexander Satanovsky
(74) *Attorney, Agent, or Firm* — Chen Yoshimura LLP (57) ABSTRACT

A circuit constant analysis method for an equivalent circuit of an inductance element includes determining values of various elements constituting the equivalent circuit from measured values of select electrical characteristics of the actual inductance element. The equivalent circuit includes: a parallel circuit connecting in parallel an inductance Ls, a capacitance Cp, and a resistance Rp; a capacitance Cr connected in series to said resistance Rp; an inductance Lr connected in parallel to said resistance Rp; a resistance Rs connected in series to said parallel circuit; a plurality of closed circuits including a resistance Rmi and an inductance Lmi magnetically coupled with a coupling coefficient ki by a mutual inductance Mi to said inductance Ls; and a resistance Rc connected in series to said capacitance Cp.

4 Claims, 10 Drawing Sheets

(56) References Cited

OTHER PUBLICATIONS

Written Opinion (PCT/ISA/237) issued in PCT/JP2009/070792 mailed in Jan. 2010.
Japanese Office Action dated Jul. 24, 2012, in a counterpart Japanese patent application No. 2010-542143.
Mandal et al., "A wide-band lumped element compact CAD model of Si-based planar sprial inductor for RFIC design", Proceedings of the 19th International Conference on VLSI Design, IEEE, Jan. 3-7, 2006, pp. 1-6.
International Search Report (ISR) issued in PCT/JP2009/070792 (International application) mailed in Jan. 2010 for Examiner consideration.

* cited by examiner

```
                    ( start )
                        ↓
```

| | |
|---|---|
| Determination of Rs: Set Rs to the measured value of DC resistance. | S1 |
| Determination of Ls: Measure the impedance $X_L$ at the frequency $f_L$ where Z becomes approximately equal to jX at a frequency below or equal to the resonance point. Substitute this into the formula $Ls = X_L/(2\pi f_L)$. | S2 |
| Determination of Rp: Measure the experimental value of Ro at the resonance point, and substitute this into expression $Rp = Ro$ | S3 |
| Determination of Cp: Measure the resonance frequency fo, and substitute this into the formula $Cp = 1/(2\pi fo)^2/Ls$. | S4 |
| Determination of Lr: Substitute the frequency $f_{Lr}$ (where suppression of the rising edge of the resistance part of the inductance is desired) and Rp into the formula $Lr = Rp/(2\pi f_{Lr})$. | S5 |
| Determination of Cr: Substitute of the frequency $f_{Cr}$ (where the inductance imaginary part (reactance part) of the inductance element becomes maximum) and Rp into the formula $Cr = 1/(2\pi f_{Cr}Rp)$. | S6 |
| Determination of the multiple loop circuit constants $Rm_i$ and $Lm_i$: Determine the frequency $fm_n$ of the inflection of the Q value below the resonance frequency. Determine the respective values that satisfy the formula $2\pi fm_n = Rm_i/Lm_i$. | S7 |
| Determination of circuit constants $K_i$ of the multiple closed loops: The $K_i$ values are obtained from simultaneous equations by substituting in the frequency $fm_n$ and the actually measured $Q_n$ of the Q value at that frequency.<br>$Q=\|X\|/R \quad Z=R+jX \quad Z=Rs+Z_L//Zc//Zr$<br>$Z_L=\sum((2\pi fK_i)^2 Rm_iLs/Lm_i)/((2\pi f)^2 + (Rm_i/Lm_i)^2) + j2\pi fLs(1 - \sum((2\pi fK_i)^2/((2\pi f)^2 + (Rm_i/Lm_i)^2))$<br>$Zc=1/(j2\pi fCp)$<br>$Zr=Rp/(1 + Rp/(j2\pi fLr)) + 1/(j2\pi fCr)$ | S8 |
| Determination of Rc: Rc is obtained from substituting into the below listed formulae the actually measured Qc of the Q value at a frequency greater than or equal to the resonance frequency as well as substituting this frequency fc.<br>$Q=\|X\|/R \quad Z=R+jX \quad Z=Rs+Z_L//Zc//Zr$<br>$Z_L=\sum((2\pi fK_i)^2 Rm_iLs/Lm_i)/((2\pi f)^2 + (Rm_i/Lm_i)^2) + j2\pi fLs(1 - \sum((2\pi fK_i)^2/((2\pi f)^2 + (Rm_i/Lm_i)^2))$<br>$Zc=1/(j2\pi fCp)+Rc$<br>$Zr=Rp/(1 + Rp/(j2\pi fLr)) + 1/(j2\pi fCr)$ | S9 |

```
                    ( end )
```

EQUIVALENT CIRCUIT OF INDUCTANCE ELEMENT, METHOD OF ANALYZING CIRCUIT CONSTANT, CIRCUIT CONSTANT ANALYSIS PROGRAM, DEVICE FOR ANALYZING CIRCUIT CONSTANT, CIRCUIT SIMULATOR

TECHNICAL FIELD

The present invention relates to circuit constant analysis technology relating to an inductance element, and more particularly to an equivalent circuit, circuit constant analysis method, circuit constant analysis program, circuit constant analysis device, and circuit simulator for an inductance element.

BACKGROUND ART

Figure 1A:
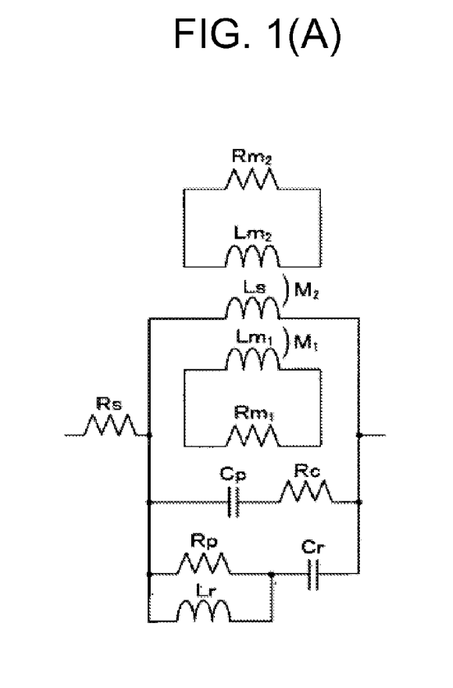
FIG. 1(A) is a circuit diagram showing an example of the equivalent circuit of the present invention for an inductance element.
Figure 1B:
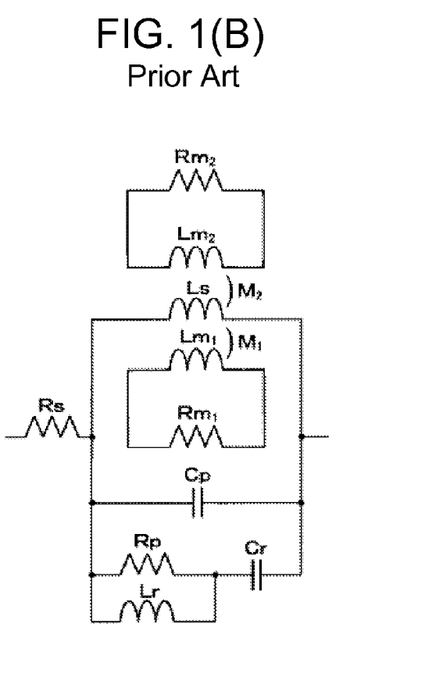
FIG. 1(B) is a circuit diagram showing an example of a conventional equivalent circuit.

Patent Document 1 below contains a description of a conventional inductance element circuit constant analysis method. The equivalent circuit of the inductance element in this Patent Document 1, as shown in FIG. 1(B), is configured as a parallel circuit including an inductance Ls, a capacitance Cp, and a resistance Rp. To this parallel circuit, added are:

(a) another capacitance Cr connected in series to the above-described resistance Rp, (b) another inductance Lr connected in parallel to the above-described resistance Rp, (c) another resistance Rs connected in series to the above-described parallel circuit, (d) a first closed circuit including a resistance Rm1 and an inductance Lm1 so as to be magnetically coupled with the above-described inductance Ls with a coupling coefficient k1 by way of a mutual inductance M1, and (e) a second closed circuit including a resistance Rm2 and an inductance Lm2 so as to be magnetically coupled with the above-described inductance Ls with a coupling coefficient k2 by way of a mutual inductance M2. Furthermore, $M1=k1 \cdot \sqrt{(Ls \cdot Lm1)}$ and $M2=k2 \cdot \sqrt{(Ls \cdot Lm2)}$.

By the use of this type of equivalent circuit, circuit constant analysis can be performed at high accuracy that is capable of good indication of the characteristics of an inductance element, and it is particularly possible to perform circuit constant analysis that is useful for an inductance element utilizing a ferrite material.

Figure 2A:
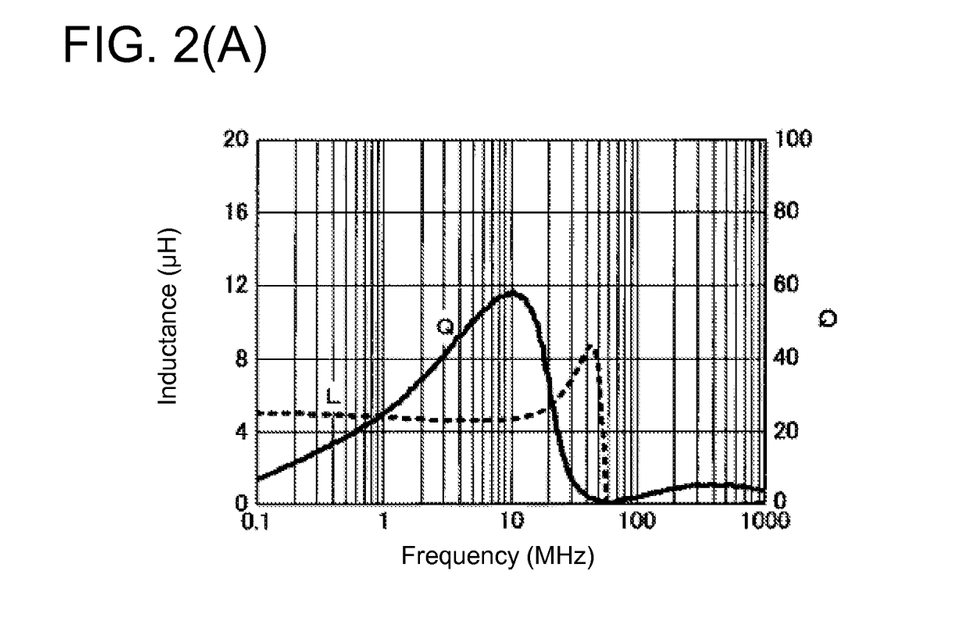
FIG. 2(A) is a graph showing an example of actually measured values of characteristics of an inductance element.
Figure 2B:
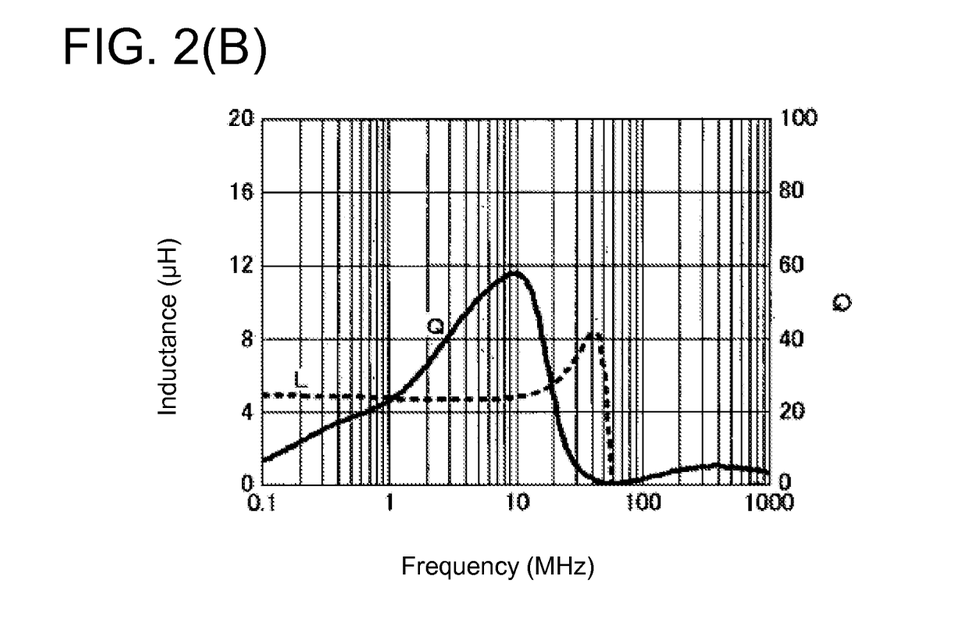
FIG. 2(B) is a graph showing characteristics according to an embodiment of the present invention.
Figure 2C:
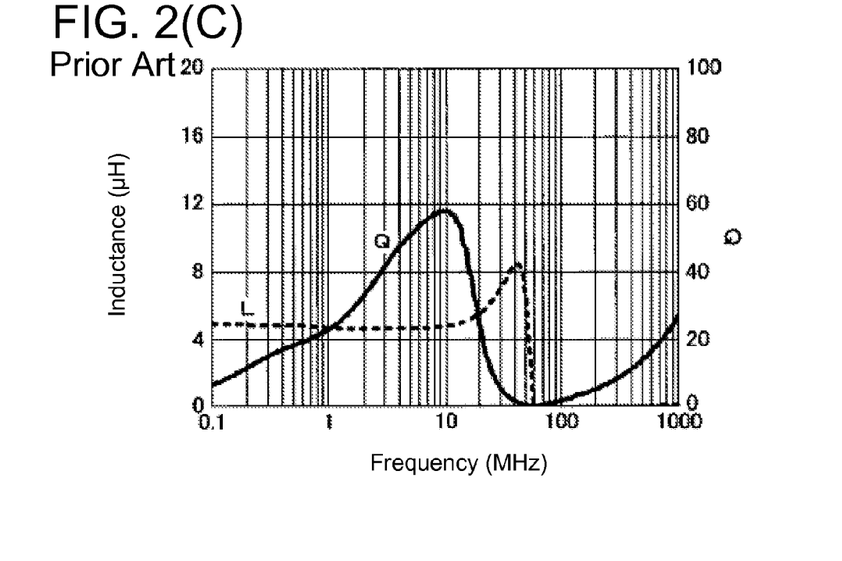
FIG. 2(C) is a graph showing characteristics based on a conventional example.

However, when the above-described background art equivalent circuit is used for approximation of an inductance element having characteristics as indicated by the solid line curve in FIG. 2(A), the resultant characteristics become similar to those shown in FIG. 2(C). Upon comparison of both of these curves, a good result is found to have been obtained overall for the inductance L and also the Q value. In particular, sufficiently approximated characteristics are obtained in the band region less than or equal to the resonance frequency (L>0).

Furthermore, a specific example of the circuit constants for obtaining the characteristics of FIG. 2(C) is listed as follows for the parallel circuit constants of Ls=4.8 µH, Rp=4100Ω, and Cp=1.3 pF:

(a) Lr=33 µH,
(b) Cr=0.86 pF,
(c) Rs=0.46 Ω,
(d) Lm1=4.8 µH, Rm1=27.1Ω, k1=0.22,
(e) Lm2=4.8 µH, Rm2=307.5Ω, k2=0.133.

However, in the band region greater than or equal to the resonance frequency, the Q value is excessively high, and the approximation of loss is not necessarily sufficient. Although, for example, the noise countermeasure function of an impedance element is realized at frequencies greater than or equal to the resonance frequency, if the above-described conventional equivalent circuit is used, then a good simulation for verification of this function might not be possible in the high frequency region at frequencies greater than or equal to the resonance frequency.

RELATED ART DOCUMENTS

Patent Documents

Patent Document 1: Japanese Patent No. 3482351

SUMMARY OF THE INVENTION

Problems to be Solved by the Invention

The object of the present invention is to provide an equivalent circuit, a circuit constant analysis method, a circuit constant analysis program, a circuit constant analysis device, and a circuit simulator for an inductance element that are capable of good approximation of characteristics even in the band region greater than or equal to the resonance frequency.

Means for Solving the Problems

In order to attain the above-described object, the present invention equivalent circuit for an inductance element includes: a parallel circuit connecting in parallel an inductance Ls, a capacitance Cp, and a resistance Rp; a capacitance Cr connected in series to the resistance Rp; an inductance Lr connected in parallel to the resistance Rp; a resistance Rs connected in series to the parallel circuit; a plurality of closed circuits including a resistance Rmi and an inductance Lmi magnetically coupled with a coupling coefficient ki by a mutual inductance Mi to the inductance Ls; and a resistance Rc connected in series to the capacitance Cp.

The circuit constant analysis method for an inductance element for analysis of circuit constants in the above-described equivalent circuit of the inductance element of the present invention includes: determining a value of the resistance Rs from a measured value of DC resistance of the inductance element; determining a value of the inductance Ls from a measured value of the impedance when the impedance of the inductance element becomes nearly equal to the reactance; determining a value of the resistance Rp by measurement of the resistance of the inductance element at a resonance point; determining a value of the capacitance Cp from an actually measured value of a resonance frequency; determining a value of the inductance Lr from an increase of the resistance part of the impedance of the inductance element; determining a value of the capacitance Cr from a frequency at which the reactance part of the inductance element becomes maximum; determining values of the inductance Lmi and the resistance Rmi from a frequency of inflection of the Q value at a frequency less than or equal to the resonance frequency; determining a value of the coupling coefficient ki based on the determined frequency of inflection of the Q value at a frequency less than or equal to the resonance frequency, and based on an actually measured the Q value at the determined frequency; and determining a value of the resistance Rc from an actually measured value of the Q value at a frequency greater than or equal to the resonance frequency.

The circuit constant analysis program of the present invention uses a computer to realize the functions of determining circuit constants of an inductance element according to the aforementioned circuit constant analysis method and obtaining frequency characteristics of the impedance based on the determined circuit constants.

The circuit constant analysis device of the present invention includes: memory means for storage of the aforementioned program; and calculation means for executing the program to perform circuit constant analysis of an equivalent circuit of an inductance element.

The circuit simulator of the present invention is used for simulation of characteristics of a circuit including an inductance element; and the circuit simulation includes calculation means for analyzing and determining circuit constants of an equivalent circuit of the inductance element of the circuit according to the circuit constant analysis method described above and for simulating characteristics of the circuit using the determined circuit constants.

Effects of the Invention

According to the present invention, Rc is connected in series to the capacitance Cp among the parallel-connected inductance Ls, capacitance Cp, and resistance Rp. Thus characteristics of the inductance element can be well approximated, and a highly accurate simulation becomes possible. The above-described effects, objects, characteristics, and advantages of the present invention will be made apparent by the detailed description of embodiments and the appended figures.

BRIEF DESCRIPTION OF THE DRAWINGS

FIG. 1 shows circuit diagrams showing equivalent circuits of an inductance element.

FIG. 2 shows graphs indicating characteristics of an inductance element.

DETAILED DESCRIPTION OF EMBODIMENTS

Preferred embodiments of the present invention will be explained in detail below based on examples.

Embodiment 1

First, an Embodiment 1 of the present invention will be explained with reference to FIG. 1 through FIG. 4. FIG. 1(A) shows an equivalent circuit of an inductance element in the present embodiment. As shown in this FIG. 1(A), a structure is produced by connecting a resistance Rc to a capacitance Cp of the equivalent circuit shown in FIG. 1(B). That is to say, a parallel circuit had an inductance Ls, the capacitance Cp, and a resistance Rp. To this parallel circuit, added are:

(a) another capacitance Cr connected in series to the resistance Rp, (b) another inductance Lr connected in parallel to the resistance Rp, (c) another resistance Rs connected in series to the above-described parallel circuit, (d) a first closed circuit including a resistance Rm1 and an inductance Lm1 so as to be magnetically coupled with the above-described inductance Ls with a coupling coefficient k1 by way of a mutual inductance M1, (e) a second closed circuit including a resistance Rm2 and an inductance Lm2 so as to be magnetically coupled with the above-described inductance Ls with a coupling coefficient k2 by way of a mutual inductance M2, and (f) another resistance Rc connected in series to the capacitance Cp.

This example is similar to the conventional technology in that $M1=k1 \cdot \sqrt{(Ls \cdot Lm1)}$ and $M2=k2 \cdot \sqrt{(Ls \cdot Lm2)}$.

Figure 3:
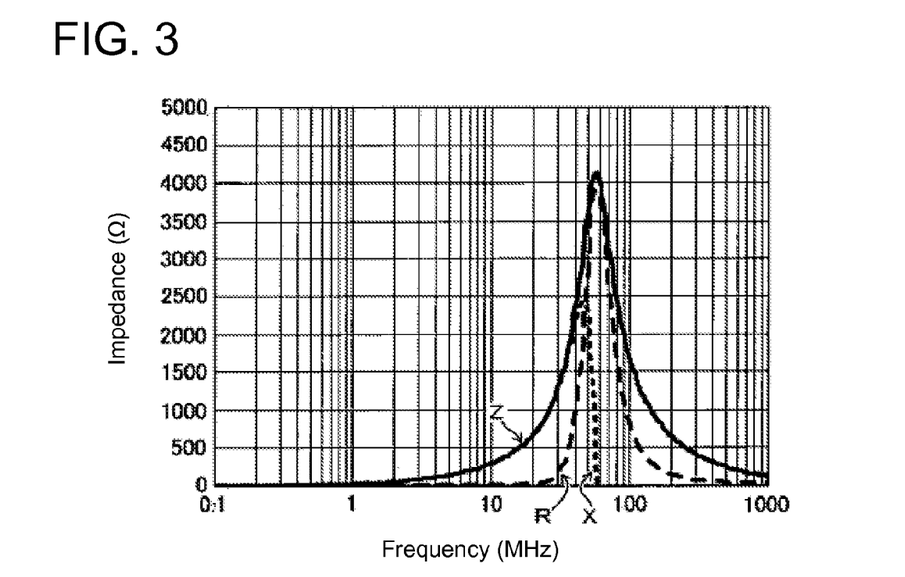
FIG. 3 is a graph showing characteristics of impedance of an inductance element subject to circuit constant analysis by an embodiment of the present invention.
Figure 4:
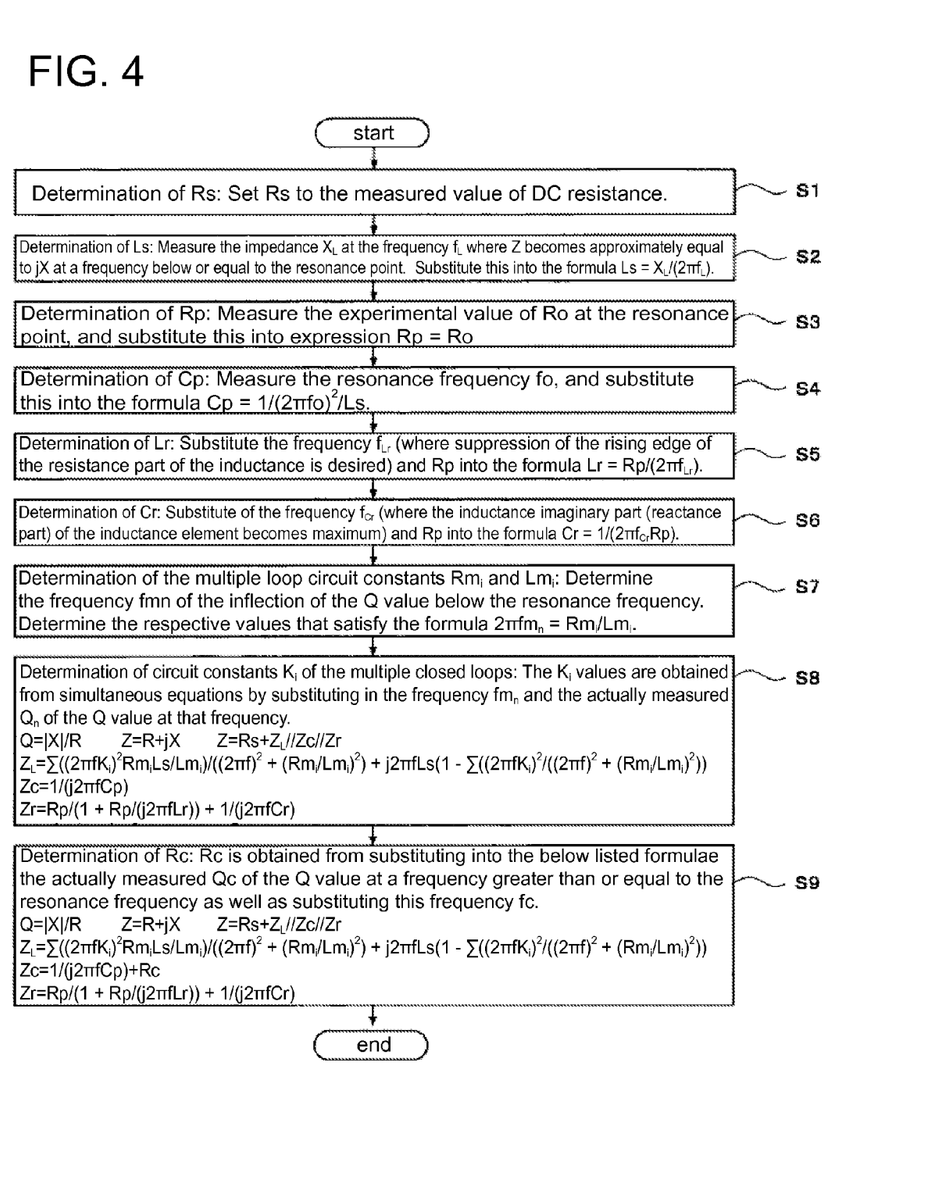
FIG. 4 is a flow chart showing the procedure of circuit constant analysis according to an embodiment of the present invention.

According to the present embodiment, the circuit constants of the equivalent circuit in FIG. 1(A) are determined by the procedure of the flowchart shown in FIG. 4. This procedure is explained below, taking as an example the determination of circuit constants of an inductance element having the frequency characteristics of impedance shown in FIG. 3 and also having the above-described frequency characteristics of Q value and inductance shown in FIG. 2(A).

(1) Resistance Rs determination (step S1): First, DC resistance between both ends of the subject inductance element is actually measured, and this value is used as the resistance Rs. In the present example, the resultant value is 0.46Ω.

(2) Determination of the inductance Ls (step S2): Thereafter, at a frequency fL less than or equal to the resonance point (64 MHz in the example of FIG. 3) at which Z becomes approximately equal to jX, the impedance XL between both ends of the inductance element is actually measured, and this value is substituted into the expression $Ls=XL/(2\pi fL)$. In the present example, based on FIG. 3, $Z \approx jX$ (where "j" is the imaginary unit) at the frequency fL=0.1 MHz. When the measured values for XL (=3Ω) and fL (=0.1 MHz) are substituted in the above-described formula, Ls becomes equal to 4.8 µH.

(3) Determination of resistance Rp (step S3): Where Ro is taken to be the actually measured value of resistance between both ends of the inductance element at the resonance point, this value is substituted into the formula Rp=Ro. In the present example, based on FIG. 3, Ro=4100Ω, and therefore Rp becomes equal to 4100Ω.

(4) Determination of the capacitance Cp (step S4): The resonance frequency fo of the inductance element is measured, and this value is substituted into the formula $Cp=1/(2\pi fo)^2/Ls$. In the present example, based on the FIG. 3, fo is equal to 64 MHz. When this value and the above-described value of Ls (=4.8 µH) determined during step 2 are substituted into the formula, Cp becomes equal to 1.3 pF.

(5) Determination of the inductance Lr (step S5): The frequency fLr at which suppression of the leading edge of the resistance part of the inductance is desired and the above-described resistance Rp determined during step S3 are substituted into the formula $Lr=Rp/(2\pi fLr)$. In the present example, when fLr (=20 MHz) obtained from FIG. 3 and Rp (=4100Ω) are substituted into the formula, the inductance Lr becomes 33 µH.

(6) Determination of the capacitance Cr (step S6): This is found by substitution of the frequency fCr (at which the impedance imaginary part (reactance part) of the inductance element becomes maximum) and the above-described resistance Rp into the formula $Cr=1/(2\pi fCr \cdot Rp)$. In the present example, based on FIG. 3, fCr becomes equal to 45 MHz and when this value and the above-described value of Rp (=4100Ω) determined during step 3 are substituted into the formula, Cr becomes equal to 0.86 pF.

(7) Determination of multiple closed loop circuit constants Rmi and Lmi (step S7): The frequency fmn of the inflection of the Q value is determined below the above-described resonance frequency fo, and thereafter, Rmi and Lmi are each determined so that the formula $2\pi fmn=Rmi/Lmi$ is satisfied.

In the present example, based on the above-described FIG. 2(A), the values for fm1 (=0.9 MHz) and fm2 (=10 MHz) are determined first. Thereafter, Lm1 (=4.8 µH), Rm1 (=27.1Ω), Lm2 (=4.8 µH), and Rm2 (=307.5Ω) are each determined.

(8) Determination of the multiple closed loop circuit constant ki (step S8): The frequency fmn of the above-described inflection of the Q value and the actually measured Qn of the Q value at this frequency are found. Then these are substituted into the simultaneous equations shown below in Formulae 1 to obtain the coupling coefficient ki.

$$Q=|X|/R$$

$$Z=R+jX$$

$$Z=Rs+ZL//Zc//Zr$$

$$ZL=\Sigma((2\pi fki)^2 Rmi \cdot Ls/Lmi)/((2\pi f)^2+(Rmi/Lmi)^2)+j2\pi f \cdot Ls(1-\Sigma((2\pi f \cdot ki)^2/((2\pi f)^2+(Rmi/Lmi)^2))$$

$$Zc=1/(j2\pi f \cdot Cp)$$

$$Zr=Rp/(1+Rp/(j2\pi f \cdot Lr))+1/(j2\pi f \cdot Cr) \quad \text{Formulae 1}$$

In the present example, based on FIG. 2(A), fm1=0.9 MHz, and Q1 (Q value at that frequency) is equal to 23.9. Also fm2=10 MHz, and Q2 (Q value at that frequency) is equal to 57.9. Thus, from the above-described simultaneous equations, k1=0.22 and k2=0.133.

(9) Determination of resistance Rc (step S9): Resistance Rc is obtained by substitution into the below listed Formulae 2 the frequency fRC greater than or equal to the resonance frequency and the actually measured value Qc of the Q value at that frequency.

$$Q=|X|/R$$

$$Z=R+jX$$

$$Z=Rs+ZL//Zc//Zr$$

$$ZL=\Sigma((2\pi fki)^2 Rmi \cdot Ls/Lmi)/((2\pi f)^2+(Rmi/Lmi)^2)+j2\pi f \cdot Ls(1-\Sigma((2\pi f \cdot ki)^2/((2\pi f)^2+(Rmi/Lmi)^2)$$

$$Zc=1/(j2\pi f \cdot Cp)+Rc$$

$$Zr=Rp/(1+Rp/(j2\pi f \cdot Lr))+1/(j2\pi f \cdot Cr) \quad \text{Formulae 2}$$

In the present example, fRC=400 MHz and Qc=5.3. Thus, based on the above-described simultaneous equations, Rc=33 Ω.

In summary, the following results are obtained:
Ls=4.8 µH, Rp=4100Ω, Cp=1.3 pF
Lr=33 µH, Cr=0.86 pF,
Rs=0.46 Ω,
Lm1=4.8 µH, Rm1=27.1Ω, k1=0.22,
Lm2=4.8 µH, Rm2=307.5Ω, k2=0.133,
Rc=33 Ω.

When the inductance frequency characteristics are calculated based on the circuit constants of the equivalent circuit of FIG. 1(A) that have been determined as described above, the result shown in FIG. 2(B). When these characteristics are compared to drawing (A) of the same figure, it can be understood that these are extremely similar, and it can be seen that it is very effective to connect to the capacitance Cp the resistance Rc in series, which becomes a loss component at frequencies greater than or equal to the resonance frequency.

Embodiment 2

Embodiment 2 of the present invention will be explained next with reference to FIG. 5 and FIG. 6. The present embodiment uses the model circuit shown in FIG. 5 and is an example of simulation of the effect of using an inductor in order to suppress noise in a digital circuit power supply line.

Figure 5:
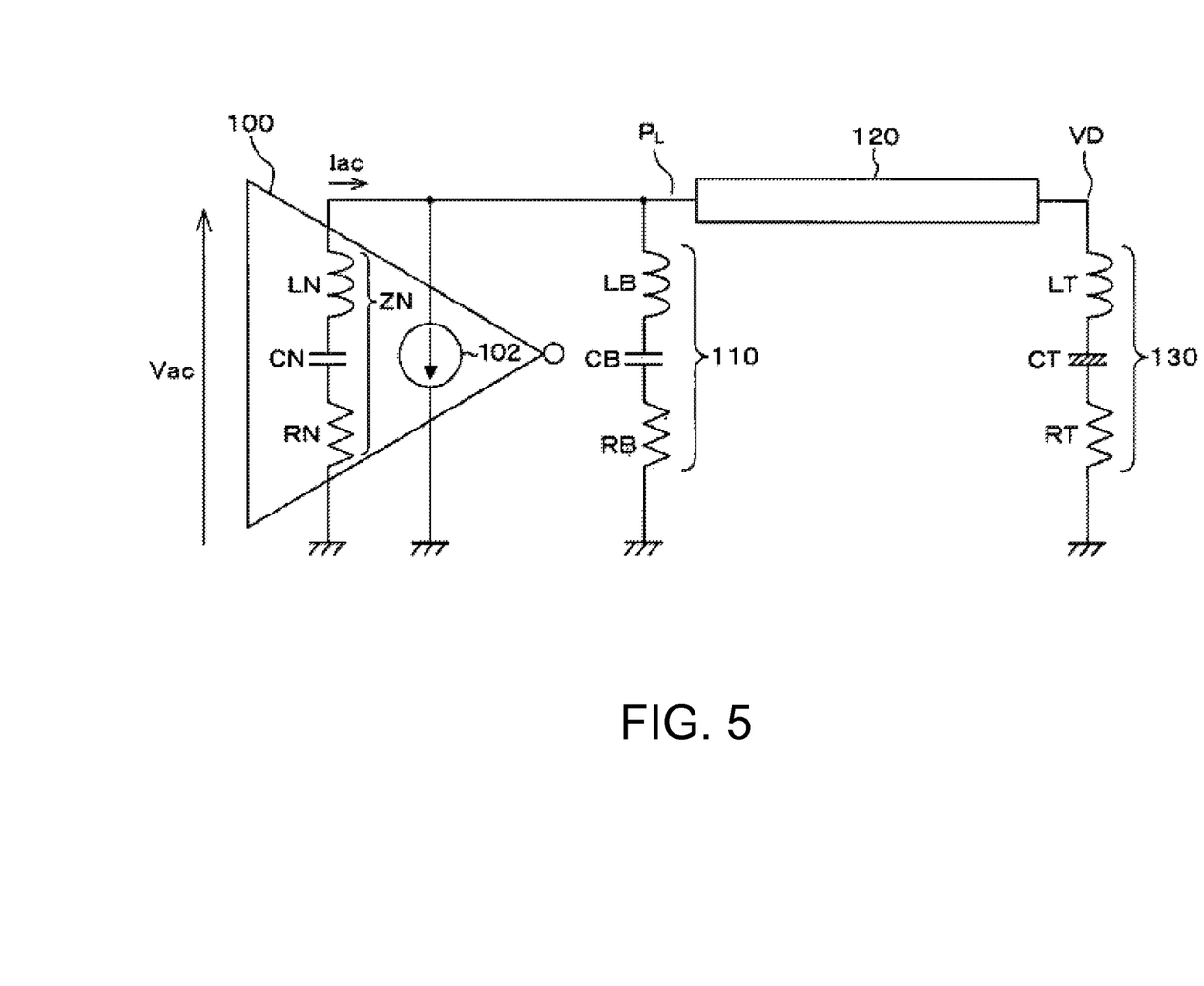
FIG. 5 is a circuit diagram showing an example of a simulation circuit of a transmission line utilizing the present invention.

As shown in FIG. 5, this model circuit is assumed to have a noise source 100 that has an electrical current supply 102 and an impedance of ZN. The impedance ZN of the noise source 100 is indicated by the series circuit that includes the equivalent inductance LN (=10 nH), the equivalent capacitor CN (=500 pF), and the equivalent resistance RN (=5Ω). Moreover, the current Iac is a comb-shaped current that includes a high frequency wave of up to 100 mA amplitude, 2 nsec width, and 2 GHz frequency. Within the figure, the voltage Vac becomes equal to ZN·Iac.

To the noise source 100 output side, a bypass capacitor 110 is connected in parallel and a line 120 is connected in series. Furthermore, a terminal capacitor 130 is connected to the output side of the line 120 to give this configuration. The bypass capacitor 110 is represented by a series circuit of an equivalent inductance LB (=0.5 nH), an equivalent capacitor CB (=1 µF), and an equivalent resistance RB (=0.01Ω). The characteristic impedance of the line 120 is 100Ω, the length is 80 mm, and the transmission delay is 0.6 nsec. The terminal capacitor 130 is expressed by a series circuit including the equivalent inductance LT (=1 nH), the equivalent capacitor CT (=10 µF), and the equivalent resistance RT (=5Ω).

Figure 6A:
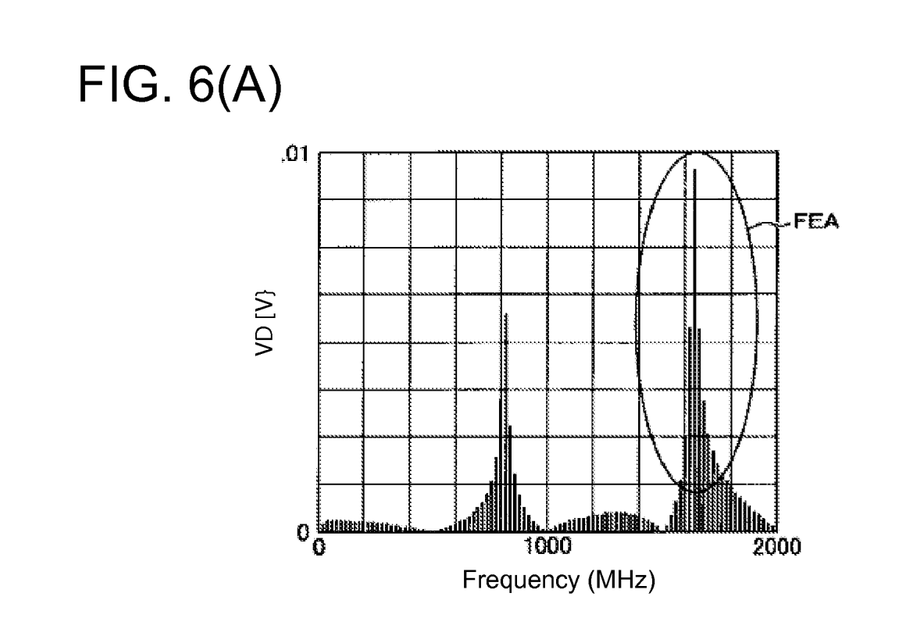
FIG. 6 is a graph showing a comparison between the conventional technology and the frequency characteristics of output-side voltage of a transmission line in the above-described simulation of FIG. 5.
Figure 6B:
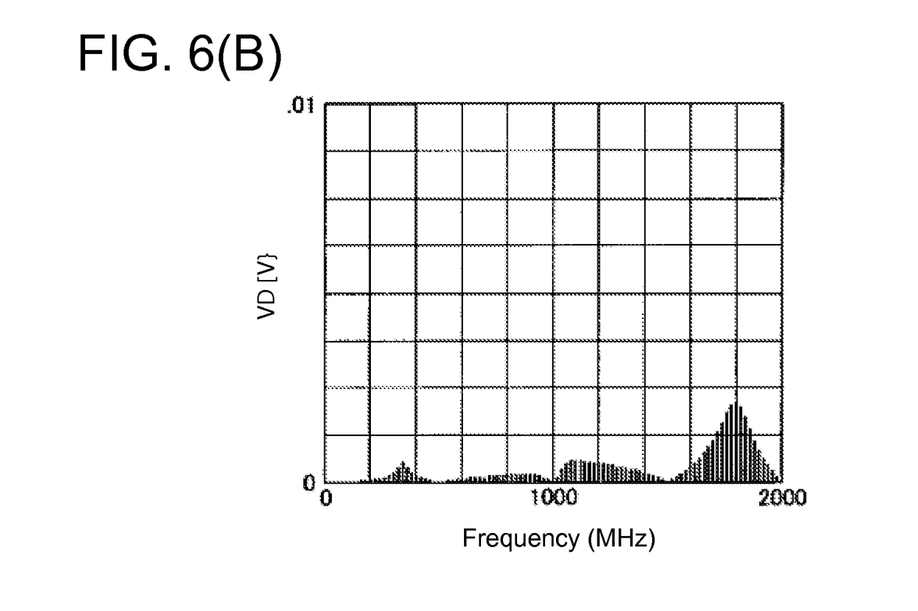
Figure 6C:
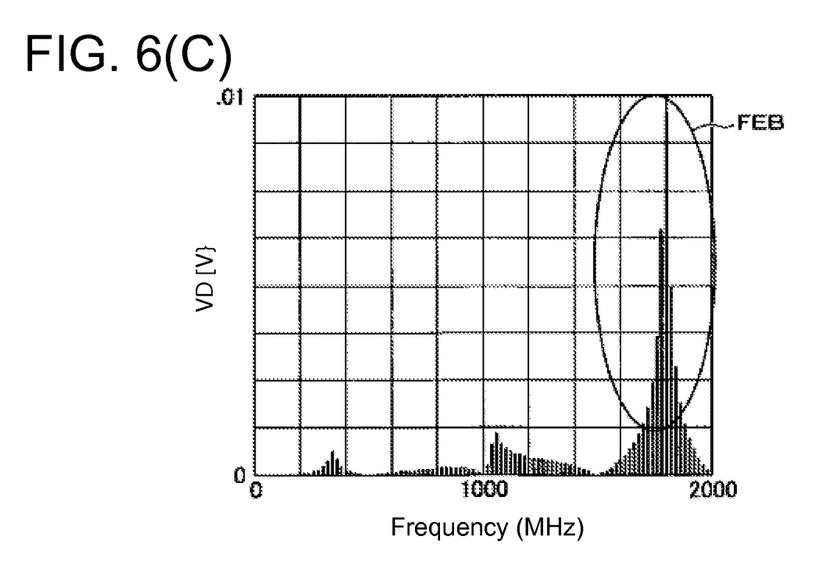

FIG. 6 shows the results when the voltage spectrum VD is observed at the terminal side of the line 120 under the above-described conditions. FIG. 6(A) is the voltage spectrum measured for the model circuit of FIG. 5. Note also that while frequency is plotted along the horizontal axis of this figure, it is not a logarithmic scale. When the equivalent circuit from the background art shown in FIG. 1(B) is plugged into the position PL as an inductor so that it is in series with line 120 and the simulation is run, the results are as shown in FIG. 6(C). As shown in this figure, there is a frequency region having the same strength (regions FEA and FEB in FIG. 6) as when there is no inductor in FIG. 6(A) in the band region greater than or equal to the resonance point (64 MHz). This is due to the Q value being higher than the actually measured value and due to the inductor loss not being calculated. That is to say, although conventionally a lowering of voltage intensity is expected due to insertion of the inductor, voltage lowering is not seen.

In contrast, the results of FIG. 6(B) are obtained when a simulation is performed by insertion of the equivalent circuit of the present invention shown in FIG. 1(A) at the position PL so as to be arranged in series with the line 120. As shown in this figure, voltage VD is well lowered in the high frequency region of frequencies greater than or equal to the resonance frequency, and the effect of the insertion of the inductance is very apparent. This is due to the equivalent circuit of the present invention giving a good approximation. Thus, by using the equivalent circuit of the present invention, the noise countermeasure effect can be readily verified by simulation.

Embodiment 3

Figure 7:
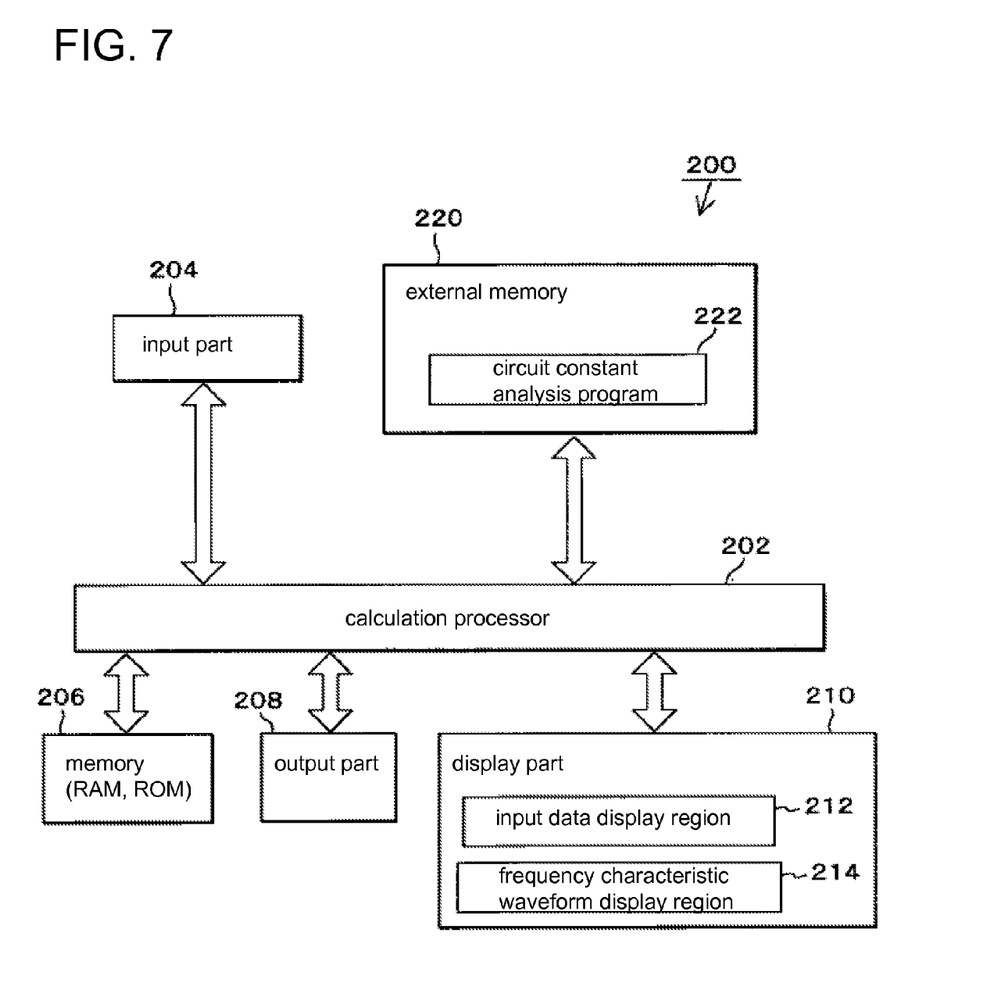
FIG. 7 is a block diagram showing an example device that performs the circuit constant analysis of the present invention.

Embodiment 3 of the present invention will next be explained. The present embodiment is an example of a circuit constant analysis device of an inductance element using the above-described analysis method. By utilization of the above-described analysis method, determination of circuit constants of the inductance element is possible by use of a computer system or the like. FIG. 7 shows the configuration of this type of circuit constant analysis device. As shown in this figure, the circuit constant analysis device 200 includes a calculation processor 202 (such as a CPU or the like), an input part 204 (such as a keyboard, mouse, or the like), memory 206 such as a RAM, an output part 208 such as a printer, a display part 210, and an external memory 220 (such as a hard disk or the like).

A circuit constant analysis program 222 for execution of the above-described analysis method of FIG. 4 is stored in the external memory 220. The program of the circuit constant analysis program 222 is read from this external memory 220 and is executed by the calculation processor 202. An input data display region 212 and a frequency characteristic waveform display region 214 are set in the display part 210. While the user refers to the input data display region 212, the user utilizes the input part 204 to input data such as actually measured values or the like. The input data are saved in the memory 206 and are displayed in the input data display region 212 of the display part 210.

Based on the input data, the circuit constant analysis program 222 is executed by the calculation processor 202 to determine the circuit constant. When the impedance Z, resistance part R, and reactance part X, and frequency characteristics of the reactance element are obtained as a result of this determination, a graph of these characteristics is displayed in the frequency characteristic waveform display region 214 of the display part 210. The user refers to this graph, and if correction is needed, the user inputs further data or corrects the data that was input. As may be required, the graph may also be printed out using the output part 208.

Embodiment 4

Figure 8A:
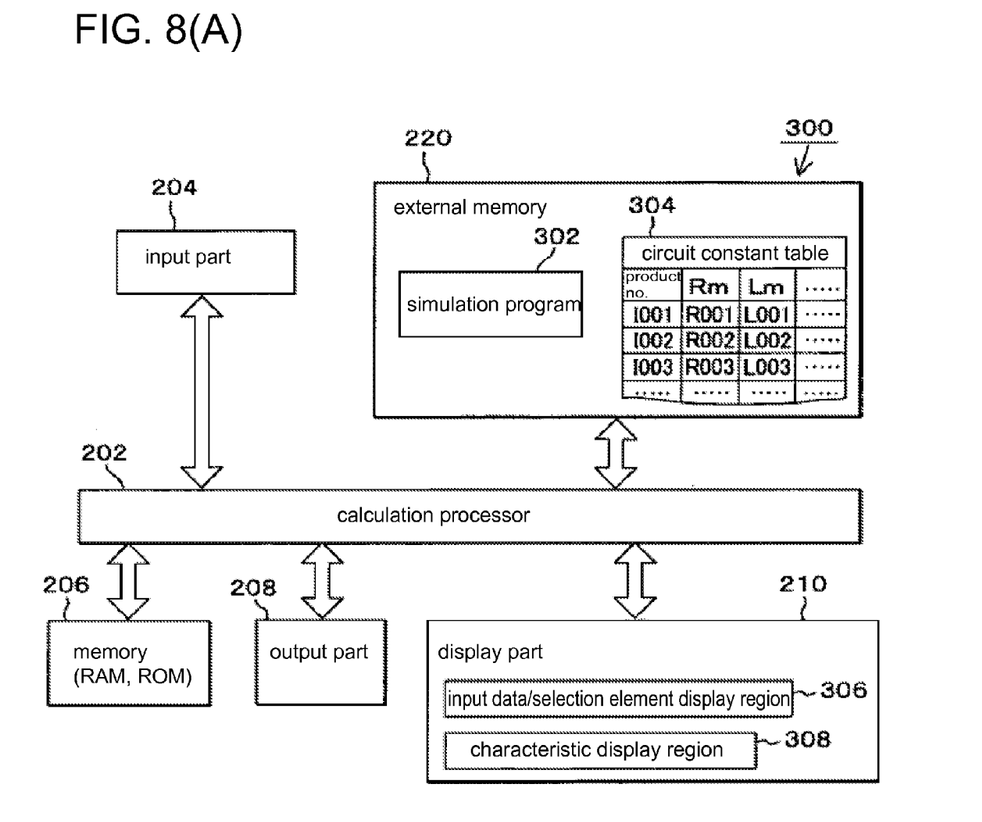
FIG. 8 is a block diagram showing an example of a device that performs the simulation of the present invention.
Figure 8B:
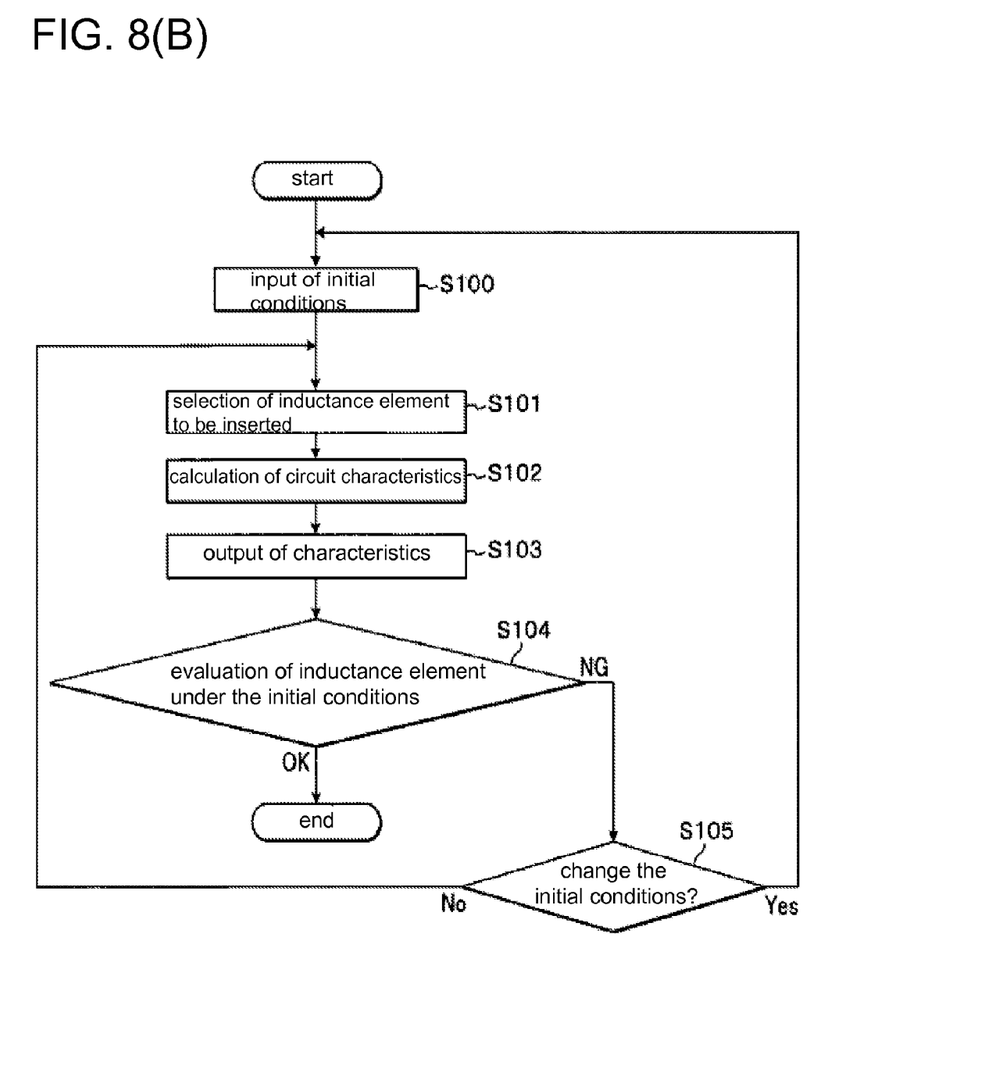

Embodiment 4 of the present invention will be explained next with reference to FIG. 8. The present embodiment is an example of a simulator using the inductance element that has its circuit constants determined according to the above-described embodiment. FIG. 8(A) shows the configuration of the simulator of the present embodiment. FIG. 8(B) shows a flowchart of the operation of the simulator. Within the simulator 300, parts corresponding to those of the above-described circuit constant analysis device 200 of FIG. 7 are assigned the same reference characters. As shown in FIG. 8(A), the external memory 220 contains the simulation program 302 and the circuit constant table 304. Moreover, an input data/selection element display region 306 and a characteristics display region 308 are set in the display part 210.

The simulation program 302 is used for performing the processing indicated in FIG. 8(B) and thus is executed by the calculation processor 202. The circuit constant table 304 lists multiple inductance elements having circuit constants determined by the above-described embodiment and also lists these circuit constants.

Overall operation of the present embodiment will next be explained. The user of the simulator 300 uses the input part 204 to input initial conditions of the circuit that is the subject of the simulation (step S100). For example, when a simulation of characteristics of a transmission line is performed, such as that described above using FIG. 5, conditions are inputted such as characteristic impedance or the like of the transmission line or the like. The conditions input are displayed in the input data/selection element display region 306 of the display part 210. Thereafter, the user selects an inductance element to be used, using the input part 204 or on the display screen 210 (step S101). The result of the selection is displayed in the input data/selection element display region 306 of the display part 210.

Based on the initial conditions that were input and the circuit constants of the selected impedance element, the calculation processor 202 next calculates the circuit characteristics using the simulation program 302 (step S102). The obtained circuit characteristics (e.g., impedance frequency characteristics or the like) are displayed in the characteristics display region 308 of the display part 210 (step S103). While referring to the display of the display part 210, the user make an evaluation of whether the selected inductance element is good or not (step S104). If a deficiency in the characteristics is found as a result of this evaluation (result of step S104 is NG), either the initial conditions are revised (YES in step S105) or the inductance element is reselected (NO in step S105).

The present invention is not limited to the above-described embodiments, and various types of modifications can be made within a scope that does not depart from the spirit of the present invention. For example, the modifications listed below may be included.

(1) The values of the frequencies, actual measurements, and circuit constants indicated in the above-described embodiments are illustrative, and the present invention is in no manner limited to such values. Also the circuit constants determined in the above-described embodiments may be fine-adjusted to values in the vicinity of such circuit constants values in order to further approach the actually measured values.

(2) Although the above-described embodiments included an equivalent circuit having two magnetically coupled circuits using resistances and inductances, additional multiple magnetically coupled circuits may be provided if needed. For example, such further provision is desirable when the inductance part or the Q value departs from the actually measured values at several locations.

(3) By connecting an inductance element having the circuit constants obtained according to the present invention as an equivalent circuit, it is possible to obtain a pseudo-inductance element having the desired characteristics.

(4) The circuit constant analysis device of FIG. 7 and the simulation device of FIG. 8 may be combined. For example, the circuit constant analysis program 222 and the simulation program 302 may each be contained in the external memory 220, or the simulation program 302 may incorporate the circuit constant analysis program 222. In these cases, rather than the operation of selecting the inductance element in step S101 of FIG. 8(B), the circuit constant analysis program 222 of FIG. 4 may be executed.

INDUSTRIAL APPLICABILITY

The present invention connects a resistance as a loss component in series with capacitance connected in parallel. Thus, highly accurate circuit constant analysis of an inductance element becomes possible, and the present invention is used advantageously for characteristic simulation or the like of a circuit that includes an induction element.

DESCRIPTION OF REFERENCE CHARACTERS 100 noise source
102 electrical current supply
110 bypass capacitor
120 line
130 terminal capacitor
200 circuit constant analysis device
202 calculation processor
204 input part
206 memory
208 output part
210 display part
212 input data display region
214 frequency characteristic waveform display region
220 external memory
222 circuit constant analysis program
300 simulator
302 simulation program
304 circuit constant table
306 input data/selection element display region
308 characteristics display region

The invention claimed is:

1. A circuit constant analysis method for an inductance element for analyzing circuit constants of an equivalent circuit of the inductance element, said equivalent circuit including:

a parallel circuit connecting in parallel an inductance $L_s$, a capacitance $C_p$, and a resistance $R_p$;
a capacitance $C_r$ connected in series to said resistance $R_p$;
an inductance $L_r$ connected in parallel to said resistance $R_p$;
a resistance $R_s$ connected in series to said parallel circuit;
a plurality of closed circuits including a resistance $R_{mi}$ and an inductance $L_{mi}$ magnetically coupled with a coupling coefficient $k_i$ by a mutual inductance $M_i$ to said inductance $L_s$; and
a resistance $R_c$ connected in series to said capacitance $C_p$,
the circuit constant analysis method comprising executing the following steps via a processor:
determining a value of said resistance $R_s$ from a measured value of DC resistance of the inductance element;
determining a value of said inductance $L_s$ from a measured value of the impedance when the impedance of said inductance element becomes nearly equal to the reactance;
determining a value of said resistance $R_p$ by measurement of the resistance of said inductance element at a resonance point;
determining a value of said capacitance $C_p$ from an actually measured value of a resonance frequency;
determining a value of said inductance $L_r$ from an increase of the resistance part of the impedance of said inductance element;
determining a value of said capacitance $C_r$ from a frequency at which said reactance part of said inductance element becomes maximum;
determining values of said inductance $L_{mi}$ and said resistance $R_{mi}$ from a frequency of inflection of the Q value at a frequency less than or equal to said resonance frequency;
determining a value of said coupling coefficient $k_i$ based on said determined frequency of inflection of the Q value at a frequency less than or equal to said resonance frequency, and based on said actually measured the Q value at said determined frequency; and
determining a value of said resistance $R_c$ from an actually measured value of the Q value at a frequency greater than or equal to the resonance frequency.

2. A computer readable non-transitory storage medium storing a circuit constant analysis program thereon, the program being configured to cause a computer to perform functions of determining circuit constants of an inductance element according to said circuit constant analysis method of claim 1 and obtaining frequency characteristics of the impedance based on said determined circuit constants.

3. A circuit constant analysis device comprising:
the computer readable non-transitory storage medium of claim 2; and
a calculation processor for executing said program and for performing circuit constant analysis of the equivalent circuit of the inductance element.

4. A circuit simulator for simulation of characteristics of a circuit including an inductance element, comprising a calculation processor for analyzing and determining circuit constants of an equivalent circuit of said inductance element according to the circuit constant analysis method of claim 1, and for simulating characteristics of said circuit using said determined circuit constants.

* * * * *